United States Patent [19]

Thomas et al.

[11] Patent Number: 4,675,091
[45] Date of Patent: Jun. 23, 1987

[54] CO-SPUTTERED THERMIONIC CATHODES AND FABRICATION THEREOF

[75] Inventors: Richard E. Thomas, Riverdale, Md.; Victor H. Ritz, Alexandria, Va.

[73] Assignee: United States of America as represented by the Secretary of the Navy, Wasington, D.C.

[21] Appl. No.: 852,601

[22] Filed: Apr. 16, 1986

[51] Int. Cl.⁴ ............................................. C23C 14/00
[52] U.S. Cl. ........................ 204/192.15; 204/192.12; 204/192.3; 252/521; 313/346 R
[58] Field of Search ...................... 204/192.15, 192.12, 204/192.3; 252/521; 313/346 R

[56] References Cited

U.S. PATENT DOCUMENTS

| | | | |
|---|---|---|---|
| 3,348,092 | 10/1967 | Beggs | 313/346 |
| 3,425,111 | 2/1969 | Denison | 313/346 R |
| 4,010,312 | 3/1977 | Pinch et al. | 204/192.15 |
| 4,251,569 | 2/1981 | Mager et al. | 252/521 |
| 4,359,489 | 11/1982 | Corneille | 427/77 |
| 4,369,392 | 1/1983 | Hotta et al. | 313/346 R |
| 4,407,709 | 10/1983 | Enjouji et al. | 204/192.15 |
| 4,411,827 | 10/1983 | Corneille | 252/521 |
| 4,412,942 | 11/1983 | Naarmann | 252/521 |
| 4,465,577 | 8/1984 | Tanielian | 204/192.15 |
| 4,518,890 | 5/1985 | Taguchi | 313/346 R |

Primary Examiner—Arthur P. Demers
Attorney, Agent, or Firm—John L. Forrest; Andrew M. Lesniak

[57] ABSTRACT

A thermionic cathode fabricated by cosputtering alkaline earth oxide and metal powders under temperature and pressure conditions that ensure a metal particle size in a preferred range.

11 Claims, 2 Drawing Figures

CO-SPUTTERED THERMIONIC CATHODES AND FABRICATION THEREOF

This invention relates to the fabrication of thermionic cathodes and to resultant cathode structures, and more particularly to the fabrication of thermionic cathodes via sputtering technology.

BACKGROUND OF THE INVENTION

Alkaline-earth oxides have long been used as electron emissive coatings on cathode surfaces, since they are known to be the most efficient materials for stable thermionic emission (i.e., they have the highest emission density for a given operating temperature). The limitations to using these materials in their pure form in very high emission density applications are:

(a) The resistivity at operating temperature is such that excessive Joule heating of the coating occurs, causing catastrophic breakdown effects in the coating (arcing and sparking).

(b) Pure barium oxide (BaO) (which is the most commonly used of these compounds) is an n type semiconductor, so that the work function is dependent on donor density. The donor density can be changed significantly by the absorption of small amounts of residual tube gases. This results in a cathode that is unacceptably sensitive to the poisoning effect of a high power tube environment, compared to alternative cathode structures.

(c) Pure BaO is usually applied to the surface of the cathode in the form of a sprayed on coating. The adherence of these coatings is such that mechanical shocks will often cause them to peel or flake off.

Various fabrication methods have been devised to try to overcome the limitations described above, and yet take advantage of the low work function properties of the alkaline earth oxide materials. Some of these are the following:

(a) Bariated Nickel-or Nickel Matrix Cathode—This cathode utilizes a pressed and sintered matrix of nickel which is formed from nickel powder. The matrix is then impregnated by various means with carbonates of the alkaline earth oxides. The carbonates are converted to oxides upon heating. The exposed oxide on the emitting surface provides low work function on that fraction of the surface which it occupies. The limitations of this structure are as follows:

(1) Because of the large pore sizes in the sintered nickel matrix (5-10 microns) the resistivity effects in the oxide particles are not completely eliminated. In addition, the fraction of the surface covered by oxide is approximately equal to the pore volume in the sintered matrix. This cannot be much greater than 30 percent and still maintain the mechanical integrity of the matrix. Thus the "good" emitting area of the surface is limited by that fraction.

(2) The size of the sintered plug must also be thick enough to maintain mechanical integrity. This usually requires a minimum thickness of 0.040 inches (depending on the cathode area). Thus, a lower limit on the mass of the cathode is determined by this factor. This will limit the rate of temperature rise of the cathode, and its consequent usefulness in "fast turn on" applications.

(3) The conventional technology is to use nickel for the matrix of these cathodes. Nickel is used primarily because it does not have a strong reducing interaction with the oxide. The technology of making matrices from more refractory metals that are also non-reducing has not been developed. The relatively high vapor pressure of nickel limits its operating temperature to less than 1000 degrees centigrade. This places an upper limit of less than 20 amperes/sq cm on the emission from these cathode structures.

(b) Coated Particle Cathode—Another approach to eliminating the resistivity problems in oxide cathodes is to coat small particles of oxide (500 to 1000 Angstroms Dia.) with nickel, and deposit a coating consisting of these particles on a nickel base. The major limitation of this cathode is, again, the low operating temperature imposed by the nickel. No technology is available to produce these cathode structures with metals other than nickel. In practice it is found that these cathodes are limited to a few amperes/sq cm for reliable performance.

(c) Dispenser Type Cathodes—Most cathodes that are used in high emission density applications are of this type. For these cathodes the operating mechanism is different from oxide types. Instead of the emission originating directly from an oxide surface, it comes from a surface onto which is diffused a monolayer of barium, which lowers the surface work function. The work function achieved in this way is considerably higher than that obtained on a well activated barium oxide surface (2.0 eV. compared to 1.5 to 1.7 eV. for the oxide). Thus, the operating temperature required to obtain emission levels greater than 20 Amperes/sq. cm. is greater than 1150 degrees Centigrade. This gives rise to excessive evaporation products from the cathode, and consequent reliability problems.

SUMMARY OF THE INVENTION

The cathode fabrication method of the present invention provides for fabricating thermionic emission structures in which the emitting surface comprises a sputter deposited film from a few hundred Angstroms to 10 microns thick. The material of the film is a mixture of alkaline earth oxides, aluminum oxide, magnesium oxide and other oxides as are necessary to optimize the emission. The oxides are mixed with refractory metal particles within the film and the mixture of metal and oxide particles is achieved by simultaneously sputtering or "cosputtering" the materials from a target of the appropriately chosen composition or from two independent sputter targets operated at appropriate rates.

The method of the invention involves fabricating a thermionic cathode by cosputtering selected material, from one or more sources, on a substrate surface under controlled conditions, by introducing a substrate having a clean substrate surface into an ambient of reduced pressure with the substrate surface held at a controlled temperature, then cosputtering a mixture of materials from the group consisting of alkaline earth oxides, aluminum oxide, magnesium oxide, and other oxides that are admixed with refractory particles of metal selected from the group consisting of tungsten, iridium, osmium, rhenium, palladium, molybdenum, and other metals onto the clean substrate surface while controlling substrate surface temperatures as needed to build up on the substrate surface a layer of material containing refractory metal particles ranging in size from about 50 to 200 Angstroms.

It is therefore an object of this invention to fabricate a thermionic cathode, and to provide the resultant improved structures.

Another object of this invention is to provide a thermionic cathode in which oxide and metal particle sizes are in the range of 50 to 200 Angstroms.

Yet another object of the invention is to fabricate a thermionic cathode comprised of particles of very fine size via control of sputtering parameters so that total resistance of a thin film of the particles is lower than attainable using prior art cathode fabrication techniques.

Still another object of the invention is to fabricate a thermionic cathode structured to minimize Joule heating effects, and therefore allow much greater current densities to be drawn from the cathode without deleterious arcing and sparking.

Another object is to fabricate a thermionic cathode having greater emission uniformity on a microscopic scale because of fine particle size in the cathode film.

Another object is to fabricate a thermionic cathode having up to 70 percent by weight of oxides selected from the group consisting of alkaline earth oxides, aluminum oxide, magnesium oxide, and other oxides.

Another object of this invention is to fabricate and to provide an improved thermionic cathode for applications requiring very high electron emission density (greater than 15 Amperes/sq cm) for modest lifetimes (200 to 1000 hrs).

Another object of this invention is to provide thermionic cathodes for fast turn on devices in which the cathode must be in a fully emitting state a few seconds after the device is turned on; this requires a cathode structure with minimal thermal inertia (low mass).

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

BRIEF DESCRIPTION OF THE PREFERRED EMBODIMENT

Figure 1:
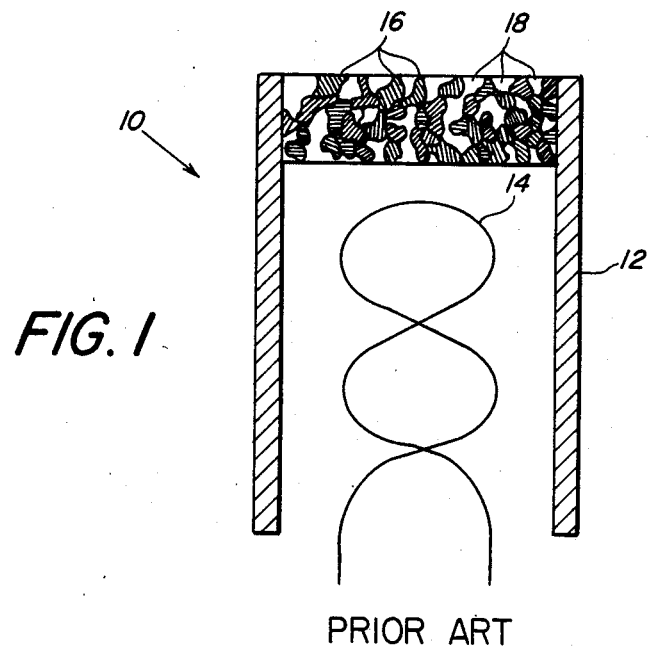
FIG. 1 is a schematic illustration of a matrix type cathode structure made in accordance with the prior art.

Prior art cathode 10 shown in FIG. 1 is a bariated nickel or nickel matrix cathode comprising a cylinrical metal support tube 12, shown in cross-section, containing a heater 14 near an end plug of nickel powder 16 (usually 5–10 micron particle size) and particles of alkaline earth oxides 18 pressed into a tube end where the upper surface of the plug forms an emitting surface.

Figure 2:
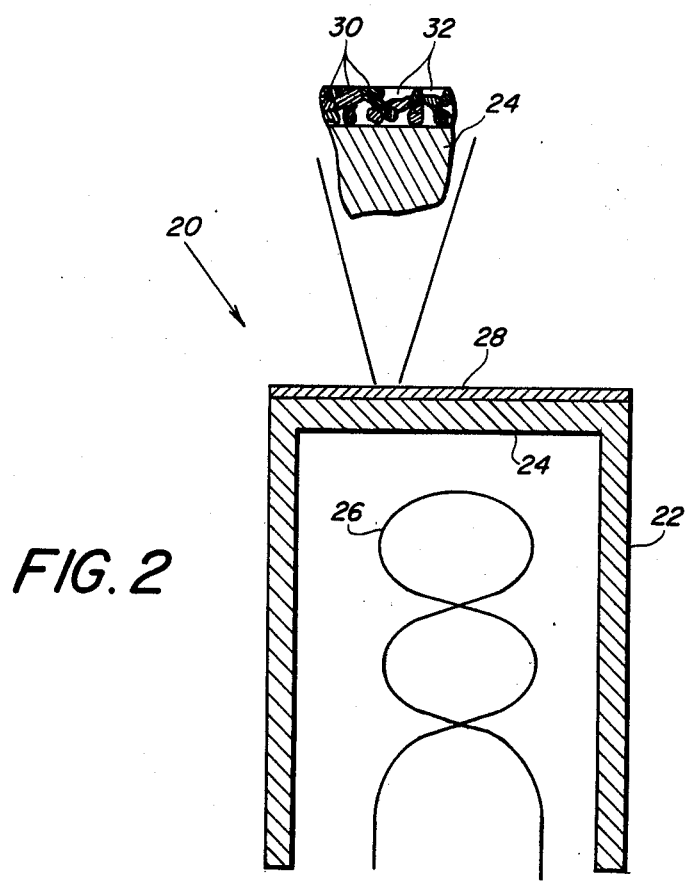
FIG. 2 is a schematic illustration of cosputtered cathode structure made in accordance with the present invention. A partly exploded view of a cosputtered cathode film is included in FIG. 2.

A co-sputtered cathode 20 shown in FIG. 2 comprises a cylindrical tungsten metal support tube 22, shown in cross-section, having a tube end wall 24, a heater 26 within tube 22 and a thin deposited film 28 comprised of metal particles 30 and alkaline earth oxides 32 forming an emitting surface.

The device described herein is a thermionic cathode 20 that utilizes the highly efficient electron emitting properties of alkaline earth oxides 32 which are deposited in a film to form the emitting surface. Mixed in with particles 32 of the oxides are finely divided metal particles 30, needed to impart electrical conductivity, and to provide a chemical reducing action necessary to maintain cathode activity. The oxide and metal particles 30 and 32 range in size from 50 to 200 Angstroms. Such particle sizes will minimize charging effects and increase electrical conductivity, compared to the present practice of using particle sizes in the micron diameter range.

The cathode emitting surface (unnumbered) common to the oxide and metal particles 30 and 32 is deposited on a wide variety of cathode surfaces by sputter deposition methods. The geometry of the cathode surface can be of any form normally required by the application. The surface, for example can be planar or non planar. Conventional sputtering systems require that the background pressure in the system (before the sputtering gas, usually argon, is introduced) be in the $10^{-6}$ Torr range. Because of the extreme susceptibility of cathodes to poisoning by certain impurities, pressures in the $10^{-7}$ Torr range are used for fabricating these cathodes.

A target (not shown) from which the film 16 is sputtered can be fabricated by various techniques. One approach is to use conventional hot pressing and sintering techniques to form the target from a mixture of alkaline earth oxide and metal powders, using the same ratio of oxide/metal that is desired as the composition of the cathode surface. A variety of metals can be used, depending on the extent of chemical interaction desired between the oxide and metal. Some metals would be tungsten, iridium, osmium, rhenium, and other metals of a refractory nature. Mixtures of these metals may be used where desired. Non-refractory metals can be used where their particular properties are needed.

A non-conventional aspect of the sputtering techniques required is that, in addition to the use of argon (or other noble gas) as the sputtering gas, in some cases it will be necessary to introduce a partial pressure of oxygen (on the order of $10^{-5}$ Torr). This is required to reoxidize those alkaline earth metals that have been disassociated from their oxide form when sputtered from the target.

Cleaning of the topmost surface of wall 24 on which the emitting materials are to be deposited is done by argon ion bombardment prior to deposition of the emissive film. This is required in order to remove native oxides and other contaminants, which might prevent reliable bonding of the deposit to the cathode surface, and also act as poisoning agents to the cathode.

Control of three other sputtering parameters are needed in order to insure that a reproducible and reliable cathode will be obtained.

I. The temperature of the cathode during deposition must be capable of being controlled over a range of 100 to 1100 degrees Centigrade. The temperature to be used for any given deposit will depend on the deposition rate, the oxides and metals used, and the thickness of the deposit.

II. The rate of deposition should be controllable from 30 Angstroms to several hundred Angstroms per minute. This, along with the temperature, affects stress build up in the films, and the size of the metal and oxide particles in the films. Excessive stress in the films will produce peeling and flaking of the film from the surface. Particle size determines the performance of the cathode in ways described in Section I. For very slow deposition rates (on the order of 50 Angstroms/minute) it has been found that substrate temperatures of 100 degrees centigrade will produce a well adhering film. Higher deposition rates will require higher temperatures.

III. The thickness must be monitored during deposition. Different cathode applications will require different thicknesses. The sputtering system should be capable of producing thickness from 1000 Angstroms to 100,000 Angstroms. For example, applications requiring longer life cathodes will need thicker deposits. Again, this parameter is interelated to the temperature and deposition rates. Thicker films and higher deposition rates will develop greater stress, and hence will require higher temperature during deposit in order to allow annealing.

EXAMPLE

A procedure that may be and has been used for fabrication of an Iridium-barium-calcium aluminate emitter using the co-sputtering process is as follows:

The wall 24 on which the film is deposited, is at one closed end of tube 22 which is a hollow tungsten cylinder and is 0.005 inches thick. A heater 26 is inserted into the open end of tube 22. A sputter target (not shown) is made by cold pressing a mixture of 5BaO:3CaO:2Al$_2$O$_3$ with an equal volume of iridium powder. The powder size for both the oxide and metal is 5–10 microns. The pressure used for pressing is 5000 lbs/in$^2$.

The source target is inserted into a sputter target holder and the tube 22 inserted in its own holder in a sputtering system. The sputtering system is then pumped until the background pressure is $2 \times 10^{-7}$ Torr. At this point the tube 22 is moved in front of an ion gun, argon is leaked into the system until the argon pressure is $5 \times 10^{-5}$ Torr, and an ion gun is turned on allowing the end of the cathode cylinder, namely the top surface of end wall 28, on which the emitting layer is to be deposited, to be sputter cleaned. This cleaning procedure is carried out for 15 minutes in order to remove oxide layers and other contaminants which might effect adherence of the emitting deposit. After the ion gun is turned off the argon pressure is increased to $2 \times 10^{-3}$ Torr and the sputter deposition power is applied (with the cathode shielded from the deposit). After the sputter removal rate of material from the target is stabilized, a shutter is opened in front of a quartz crystal micro-balance which is then exposed to the material being sputtered off the target. By monitoring the build-up of mass on the quartz crystal, the sputter deposition rate is established. The cathode cylinder is then moved in front of the sputter target (approximately 1 inch away) and held there until 1 micron thickness of Iridium-barium-calcium-aluminate has been deposited (based on a previous deposition rate calibration). During deposition, the cathode cylinder temperature is approximately 100° C. This is due to heating by the bombardment of the depositing atoms. By application of voltage to the cathode heater the temperature of the cathode can be increased to any desired value during deposition. The cathode cylinder is then removed from the deposition region, and the quartz crystal micro-balance is again exposed to the deposit to recheck the deposition rate. The deposition rate checks with the first value, indicating that the deposit was indeed one micron thick.

This completes the fabrication of the cathode. The cathode is inserted in a ultra high vacuum cathode testing facility for emission tests. This last procedure in only done for prototype cathodes. After fabrication the cathodes can normally be installed in the operating device and used.

The co-sputtering deposition process for producing an emitting layer on the cathode surface offers several advantages over prior methods for producing oxide-metal type cathode surfces.

(a) The very fine particle size (on the order of 100 Angstroms) that can be produced by proper control of sputtering parameters, reduces any charging that might take place on the oxide particles, and also lowers the total resistance for a given thickness. These features minimize Joule heating effects that are encountered in oxide and bariated nickel cathodes, and therefore allow much greater current densities to be drawn from the cathode without deleterious arcing and sparking. Greater emission uniformity on a microscopic scale is obtained because of the fine particle size.

(b) In the co-sputtering process the composition (oxide to metal ratio) of the emitting surface is directly controlled by the composition of the sputter target. This allows a much greater range of compositions than could be obtained by using the matrix approach described hereinabove. The amount of oxide that can be obtained on the surface of a matrix cathode structure is limited to about 30 percent, because of the difficulty encountered in fabricating mechanically sound metal matrices of greater than 30 percent porosity. In the co-sputtered surface the oxide composition is only limited by the amount of metal needed to achieve good electrical conductivity in the deposit. Deposits with oxide contents as high as 70 percent with adequate conductivity have been obtained. The greater the amount of oxide exposed on the surface, the greater the emission that can be obtained from the surface (higher emission for a given temperature).

(c) Because these deposits can be made as thin as will be adequate for the life requirements of the application, they will not be the limiting factor in determining the rate of temperature rise in cathode structures made using such deposits as an emitting surface. Consequently, this fabrication technique will alow the design of cathode structures with lower thermal inertia than could be achieved with conventional cathode structures. This feature is highly desirable in many applictions requiring the cathode to "turn on" fast.

(d) The co-sputtered process allows the cathode surface to be machined to the desired shape (often concave) and cleaned prior to application of the emitting material on the surface, thus avoiding contact of the emitting surface with possible sources of contamination. Some cathode fabrication techniques (namely the Medicus cathode) requires shaping and rolling of the oxides into the emitting surface. Although preparation of the material into the form of a sputter target involves pressing the powder, any contamination picked up in this process will be confined to the surface of the target. This is easily removed by simply sputtering the target for a period of time before exposing the cathode surface to the target to begin the deposition.

(e) The co-sputtered process, when compared with impregnated type matrix cathodes, has the advantage that the oxide material does not have to be transformed into a liquid phase (either by melting or dissolving into a solution) in order to mix it in with the metal matrix. The sputter process will deposit any oxide-metal mixture that can be obtained in the form of a fine powder, and pressed into a target form.

(a) This technique of fabricating the emitting cathode surface lends itself to the construction of cathodes using a variety of emitting materials, and mixtures of these materials. Some examples of such materials are: for the metal constituents—Tungsten, Iridium, Osmium, Rhenium, Palladium, and Molybdenum, and others; for the oxide constituents—BaO, CaO, $Al_2O_3$, MgO, $Cs_2O$, and others.

(b) The shape of the emitting surface can be of any form that will allow a flux of atoms to impinge over the desired emitting area.

(c) By using proper masking techniques to prevent the emitting material from depositing on predetermined areas of the cathode, non-emitting regions can be created on the surface to form an integral shadow grid. This allows the cathode emission to be controlled by a separate grid in registry with this shadow grid without the problem of interception of current by the control grid.

Obviously, numerous (additional) modifications and variations of the present invention are possible in light of the above teachings. It is therefore to be understood that within the scope of the appended claims, the invention may be practiced otherwise than as specifically described herein.

What is claimed and desired to be secured by Letters Patent of the United States is:

1. A method of fabricating a thermionic cathode by cosputtering selected materials from one or more sources on a substrate surface under controlled conditions, comprising the steps of:
    introducing a substrate of material having a clean substrate surface into an ambient of reduced pressure with said substrate surface having a controlled temperature, and
    cosputtering a mixture of materials, selected from the group consisting of alkaline earth oxides, aluminum oxide, magnesium oxide, and other oxides that are admixed with refractory particles of metal selected from the group consisting of tungsten, iridium, osmium, rhenium, palladium, molydenum, and other metals onto said clean substrate surface while controlling substrate surface temperatures as needed to build up on said substrate surface a layer of material containing refractory metal particles ranging in size from about 50 to about 200 Angstroms.

2. A method as set forth in claim 1 wherein cosputtering of said layer is performed while maintaining said ambient at background working pressure at $10^{-7}$ Torr or less.

3. A method as set forth in claim 1 wherein cosputtering of said layer is performed by using a cosputtering source comprising a mixture of alkaline earth oxides and metal particles in a ratio that is the same oxide/metal ratio desired in the composition of said cathode surface.

4. A method as set forth in claim 1 further including the step of cleaning said substrate surface prior to cosputtering of said layer by bombarding said substrate surface with argon ions prior to cosputtering, thus insuring adequate bonding of the deposit to the substrate and minimizing peeling or flaking of the deposit.

5. A method as set forth in claim 1 wherein cosputtering of said layer is performed while controlling said substrate surface temperature over a range of 100 to 1100 degrees Centigrade.

6. A method as set forth in claim 1 wherein cosputtering of said layer is performed in a manner producing a layer thickness buildup at a controlled deposition rate of from 30 Angstroms to several hundred Angstroms per minute.

7. A method as set forth in claim 1 wherein cosputtering of said layer is performed in a manner producing a layer thickness buildup at a deposition rate on the order of 50 Angstroms per minute while maintaining said substrate surface temperature at 100 degrees Centigrade.

8. A method as set forth in claim 1 wherein cosputtering of said layer is performed in a manner capable of producing layer thicknesses ranging from 1000 Angstroms to 100,000 Angstroms.

9. A thermionic cathode, comprising:
    a substrate of material;
    an emissive film on said substrate, said film being a cosputtered layer containing a mixture of oxides selected from the group consisting of alkaline earth oxides, aluminum oxide, magnesium oxide, and other oxides admixed with refractory particles of metal selected from the group consisting of, tungsten, iriduim, osmium, rhenium, palladium and molybdenum.

10. A thermionic cathode as set forth in claim 9 wherein said cosputtered layer contains up to 70 percent by weight of said oxides.

11. The thermionic cathode as set forth in claim 9 wherein said refractory particles of metal range in size from about 50 to about 200 Angstroms.

* * * * *